United States Patent
Cho

(10) Patent No.: US 7,622,356 B2
(45) Date of Patent: Nov. 24, 2009

(54) METHOD OF FABRICATING METAL OXIDE SEMICONDUCTOR FIELD EFFECT TRANSISTOR

(75) Inventor: Yong Soo Cho, Daejun-shi (KR)

(73) Assignee: Dongbu Electronics Co., Ltd., Seoul (KR)

( * ) Notice: Subject to any disclaimer, the term of this patent is extended or adjusted under 35 U.S.C. 154(b) by 0 days.

(21) Appl. No.: 12/204,181

(22) Filed: Sep. 4, 2008

(65) Prior Publication Data

US 2008/0318386 A1    Dec. 25, 2008

Related U.S. Application Data

(62) Division of application No. 11/318,480, filed on Dec. 28, 2005, now Pat. No. 7,432,541.

(30) Foreign Application Priority Data

Dec. 30, 2004    (KR)    .................. 10-2004-0117129

(51) Int. Cl.
    *H01L 21/336*    (2006.01)
(52) U.S. Cl. ................... 438/298; 438/194; 438/217; 438/276; 438/E21.335

(58) Field of Classification Search ................. 438/194, 438/217, 276, 289
See application file for complete search history.

(56) References Cited

U.S. PATENT DOCUMENTS

| | | | |
|---|---|---|---|
| 6,313,486 B1 | 11/2001 | Kencke et al. | |
| 6,689,671 B1 | 2/2004 | Yu et al. | |
| 7,037,794 B2 * | 5/2006 | Beintner et al. | ............ 438/300 |
| 2006/0057810 A1 | 3/2006 | Smith et al. | |

* cited by examiner

*Primary Examiner*—Dung A. Le
(74) *Attorney, Agent, or Firm*—Finnegan, Henderson, Farabow, Garrett & Dunner, L.L.P.

(57) ABSTRACT

There are provided a method for fabricating a MOSFET. The method includes: substrate, forming a semiconductor substrate, a germanium layer by implanting germanium (Ge) ions into a semiconductor substrate, forming an epitaxial layer doped with high concentration impurities over the germanium layer, forming a gate structure on the epitaxial layer, and forming source/drain regions with lightly doped drain (LDD) regions in the semiconductor substrate. The germanium layer supplies carriers into the epitaxial layer so that short channel effects are reduced.

6 Claims, 4 Drawing Sheets

METHOD OF FABRICATING METAL OXIDE SEMICONDUCTOR FIELD EFFECT TRANSISTOR

RELATED APPLICATIONS

This application is a divisional application of pending prior U.S. patent application Ser. No. 11/318,480 filed on Dec. 28, 2005 now U.S. Pat. No. 7,432,541, which is based on and claims priority to Korean Patent Application No. 10-2004-0117129, filed Dec. 30, 2004. The entire contents of these applications are incorporated herein by reference in their entirety.

BACKGROUND

1. Technical Field

The present invention relates to a transistor, and more particularly, to a metal oxide semiconductor field effect transistor (MOSFET) and a method of fabricating the same.

2. Description of the Related Art

To achieve a higher integration of semiconductor devices, the size of the semiconductor devices needs to be reduced. Particularly, a critical dimension (CD), which generally equals a length of a gate electrode of a metal oxide semiconductor field effect transistor (MOSFET), needs to be reduced. However, a reduced CD results in a reduced channel length of a MOSFET, which causes various problems often referred to as short-channel effects.

Short channel effects deteriorate the characteristics of the MOSFET. For instance, as the channel length decreases, a threshold voltage decreases, a drain induced barrier lowering (DIBL) phenomenon occurs, and a leakage current between a drain and a source increases.

In order to prevent or alleviate the short channel effects, there is proposed a method for implanting impurities for threshold voltage adjustment over an entire surface of a channel. However, this method does not allow high integration of semiconductor devices.

Alternative methods for alleviating the short channel effects have also been proposed. For example, in order to adjust a vertical doping profile, a super steep retrograde (SSR) well or a pocket implantation may be formed. However, these methods do not prevent the decrease in the threshold voltage due to the short channel effects. For another example, halo ion implantation regions formed in lower portions of the source/drain regions may also be formed to reduce the short channel effects.

FIG. 1 is a cross-sectional view of a semiconductor device illustrating a related art method for forming halo ion implantation regions.

Referring to FIG. 1, a gate oxide 7 and a gate electrode 9 are formed on a semiconductor substrate 1. Semiconductor substrate 1 may comprise silicon. Semiconductor substrate 1 includes a low concentration impurity region 3 and a high concentration impurity region 5 acting as a source or drain region on each side of gate oxide 7 and gate electrode 9. Oxide spacers 11 are formed on sidewalls of gate electrode 9 and gate oxide 7.

To form halo ion implantation regions 13, impurities are implanted into lower portions of the source/drain regions using gate electrode 9 and oxide spacers 11 as an ion implantation mask. Halo ion implantation regions 13 prevent the reduction in the threshold voltage and preserve the channel mobility.

However, a problem with the related art halo ion implantation method is that a junction capacitance may be increased and a junction depth is affected because the halo ion implantation regions are formed in source/drain regions as well as the semiconductor substrate region. Accordingly, when the integration density is high, the threshold voltage of devices with halo ion implantation regions is difficult to control.

SUMMARY

The present invention is directed to a metal oxide semiconductor field effect transistor (MOSFET) and a method for fabricating the same that substantially obviate one or more problems due to limitations and disadvantages of the related art. In particular, the present invention provides a MOSFET with reduced short channel effects and a method for fabricating the same.

A MOSFET consistent with embodiments of the present invention includes a semiconductor substrate; a germanium layer formed by implanting germanium (Ge) ions into the semiconductor substrate; an epitaxial layer doped with a high concentration of impurities over the germanium layer; a gate structure on the epitaxial layer; and source/drain regions with lightly doped drain (LDD) regions in the semiconductor substrate.

A MOSFET also consistent with embodiments of the present invention includes an epitaxial layer doped with high concentration impurity ions as a channel in a semiconductor substrate; a germanium layer in the semiconductor substrate and under the epitaxial layer for supplying carriers into the epitaxial layer; a gate structure on the epitaxial layer; and source/drain regions with lightly doped drain (LDD) regions, the source/drain regions being spaced apart from each other by the epitaxial layer and the germanium layer.

Consistent with embodiments of the present invention, there is also provided a method for fabricating a MOSFET that includes forming a germanium layer with a predetermined thickness by implanting germanium ions into a semiconductor substrate; etching an overlying portion of the semiconductor substrate disposed over the germanium layer to expose the germanium layer; forming an epitaxial layer doped with high concentration impurities on the exposed germanium layer; forming a gate structure on the epitaxial layer; and forming source/drain regions in the semiconductor substrate, wherein the source/drain regions are spaced apart from each other by the germanium layer and the epitaxial layer.

The MOSFET consistent with embodiments of the present invention and as described below allows carriers in the germanium layer formed under a channel region to be supplied into the channel region so that short channel effects may be reduced. Also, as a result of the increase in the concentration in the channel region, a decrease in the threshold voltage of the MOSFET is prevented.

Additional advantages and features of the invention will be set forth in part in the description which follows and in part will become apparent to those having ordinary skill in the art upon examination of the following or may be learned from practice of the invention. The features and other advantages of the invention may be realized and attained by the structure particularly pointed out in the written description and claims hereof as well as the appended drawings.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings.

DETAILED DESCRIPTION

Figure 1:
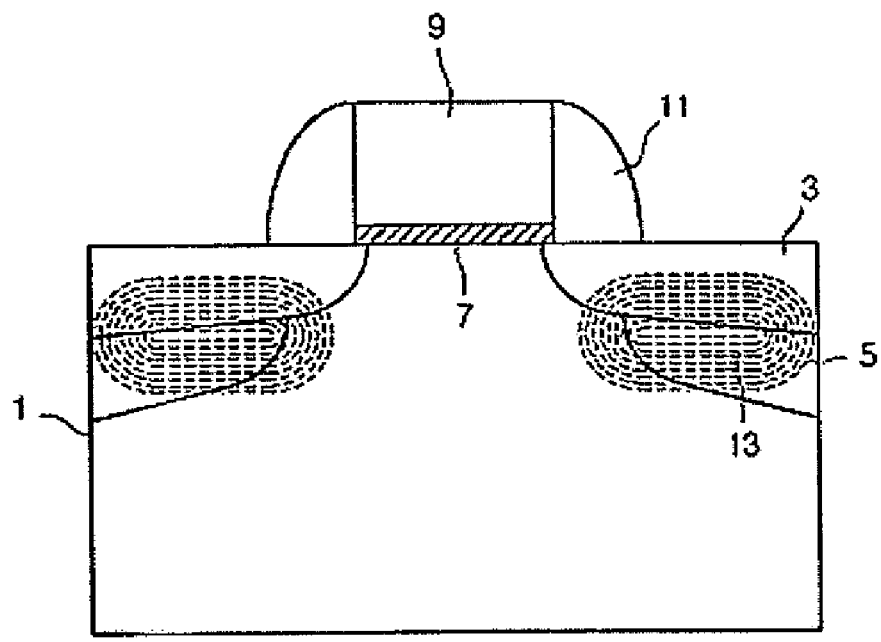
FIG. 1 is a cross-sectional view of a semiconductor device illustrating a related art halo ion implantation method.

Reference will now be made in detail to embodiments of the present invention, examples of which are illustrated in the accompanying drawings. The invention may, however, be embodied in many different forms and should not be construed as being limited to the embodiments are not limited to the scope of this invention, and can easily encompass added elements, variations, and deletions which fall within the scope of the present invention.

In the drawings, the thickness of layers and regions are exaggerated for clarity. Like reference numerals in the drawings denote like elements.

FIGS. 2 to 7 are cross-sectional views illustrating a metal oxide semiconductor field effect transistor (MOSFET) and a method for fabricating the same consistent with embodiments of the present invention.

Figure 2:
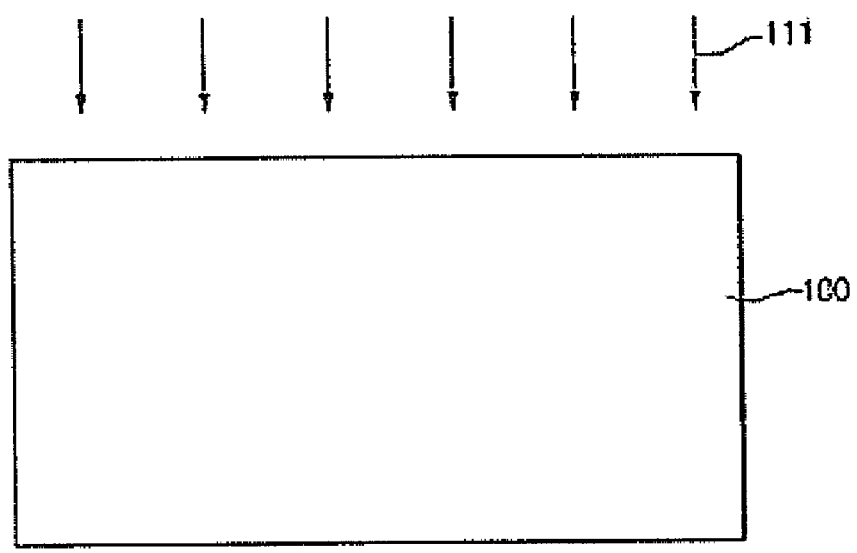
FIGS. 2 to 7 are cross-sectional views illustrating a metal oxide semiconductor field effect transistor (MOSFET) and a method for fabricating the same consistent with an embodiment of the present invention.

In FIG. 2, an ion implantation process is performed to form a well in a semiconductor substrate 100 such as a silicon substrate or the like. The ion implantation for forming the well includes a punch through (P/T) implantation and a threshold (Vt) implantation. In detail, arrows 111 in FIG. 2 denote the impurities implanted into semiconductor substrate 100. Impurities 111 may comprise any impurities suitable for a desired semiconductor device.

Additional ion implantation processes may be performed using different implantation masks to form additional impurity regions. For example, if the ion implantation process shown in FIG. 2 forms an n-type well region, an additional ion implantation process may be performed to form a p-type well region. Similarly, if the ion implantation process shown in FIG. 2 forms a p-type well region, an additional ion implantation process may be performed to form an n-type well region.

Figure 3:
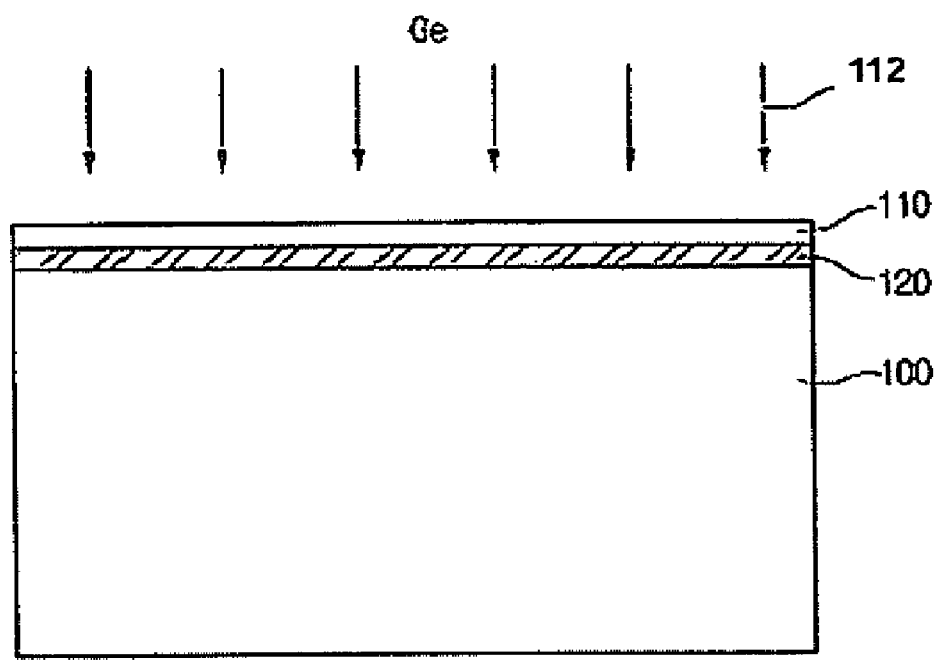

Referring to FIG. 3, germanium (Ge) is implanted into semiconductor substrate 100 by an ion implantation process 112 to form a germanium layer 120 at a predetermined depth in semiconductor substrate 100. As a result, semiconductor substrate 100 is divided by germanium layer 120 into an overlying portion 110 and an underlying portion still denoted as 100.

Figure 4:
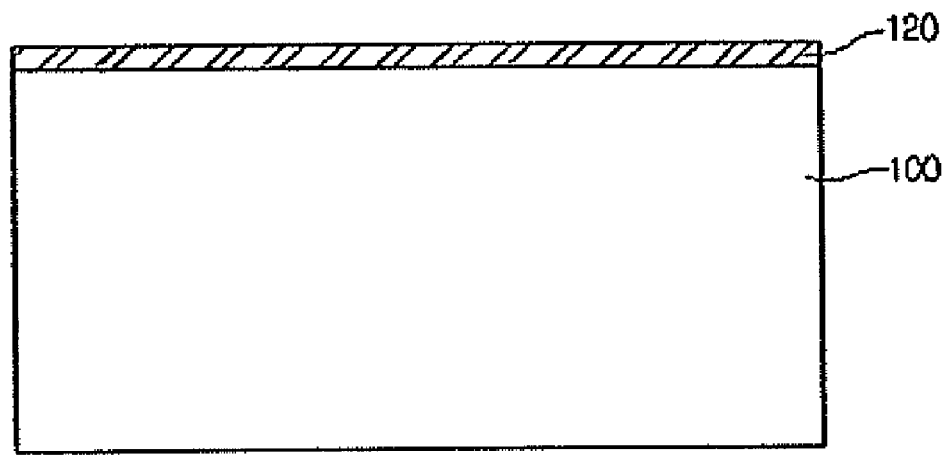

Referring to FIG. 4, overlying portion 110 on germanium layer 120 is removed to expose an upper surface of germanium layer 120. Overlying portion 110 may be removed by a wet etching process such as silicon etching, silicon oxide ($SiO_2$) etching, silicon nitride ($Si_3N_4$) etching, aluminum (Al) etching, gallium arsenide (GaAs) etching, or the like.

Figure 5:
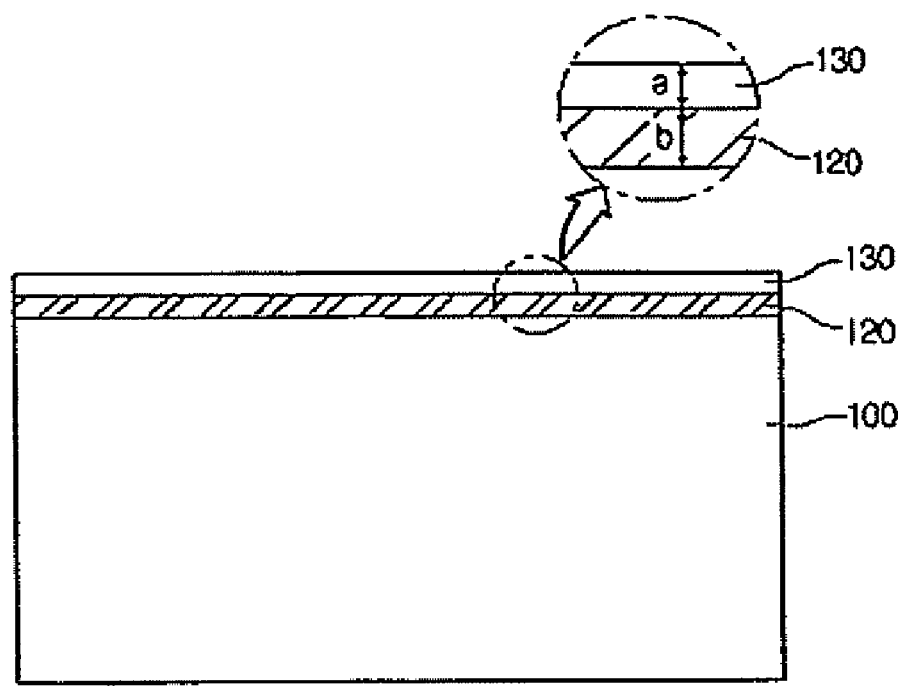

Referring to FIG. 5, an epitaxial growth is performed to form an epitaxial layer 130 on germanium layer 120. Epitaxial layer 130 may be doped with a high concentration of impurities. A process for doping impurity ions may be performed in advance before performing the epitaxial growth so that epitaxial layer 130 is doped with impurity ions of high concentration.

Figure 6:
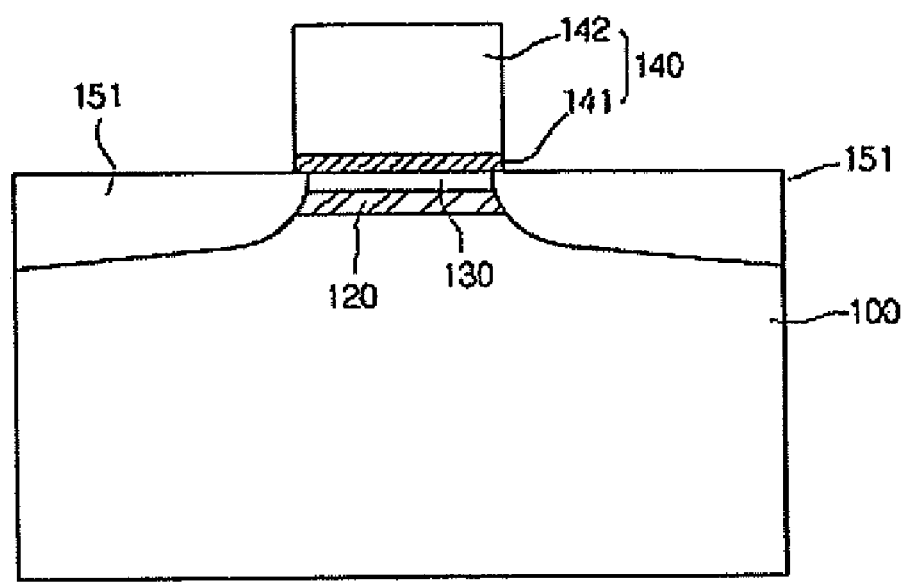

Referring to FIG. 6, a gate structure 140 is formed on epitaxial layer 130. Gate structure 140 includes a gate insulating layer 141 and a gate conductive layer 142 stacked in sequence. A lightly doped drain (LDD) ion implantation is performed using gate structure 140 as a mask to form shallow source/drain extension regions 151.

Figure 7:
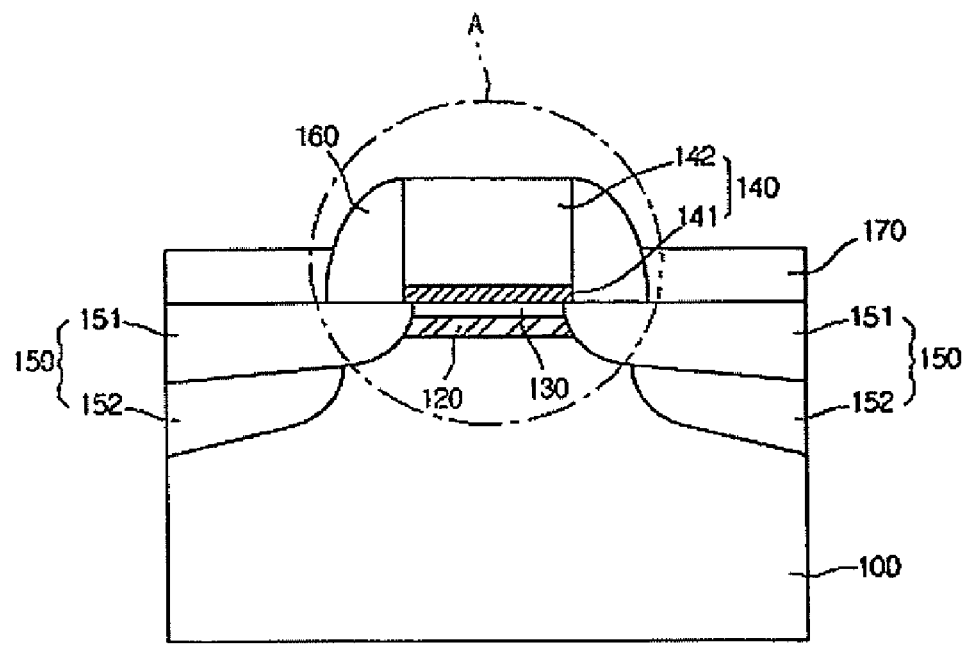

Referring to FIG. 7, after forming LDD regions 151, gate spacers 160 are formed on sidewalls of gate structure 140. An ion implantation is performed using gate structure 140 and gate spacers 160 as a mask to form deep source/drain regions 152. Deep source/drain regions 152 and shallow source/drain regions 151 together form source/drain regions 150. Source/drain regions 150 are spaced apart from each other by epitaxial layer 130 and germanium layer 120.

Next, a conventional selective epitaxial growth is performed to form a selective epitaxial layer 170 on a surface of source/drain regions 150 on both sides of gate structure 140. Selective epitaxial layer 170 prevents defects in a metal silicide layer to be formed later. Selective epitaxial layer 170 may have a thickness of about 300±100 Å.

Thus, a transistor including gate structure 140, epitaxial layer 130 as the channel thereof, and source/drain regions 150 is formed. When voltages are applied to gate conductive layer 142 and source/drain regions 150, carriers move through the channel and a current flows through the transistor.

Figure 8:
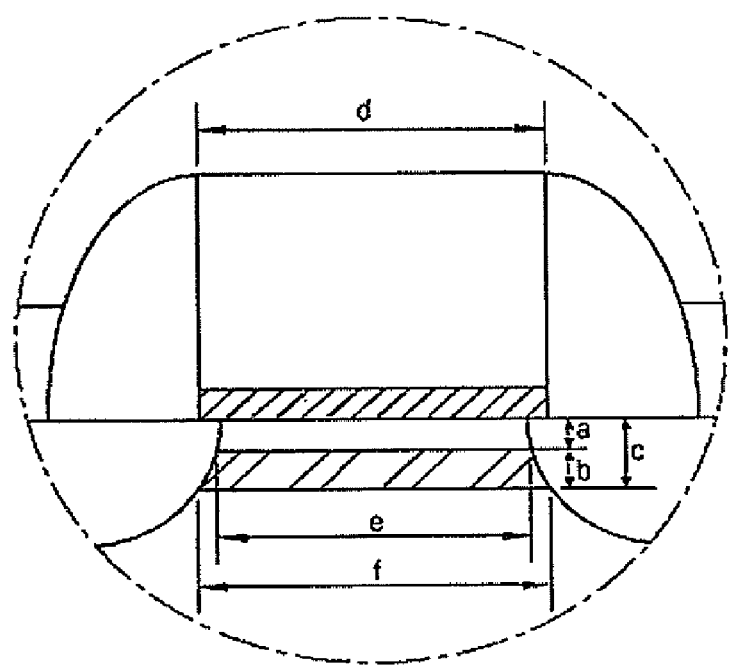
FIG. 8 is an enlarged view of a portion A illustrated in FIG. 7.

Meanwhile, a number of carriers in germanium layer 120 may move into epitaxial layer 130 and thereby increase a carrier concentration in epitaxial layer 130. As a result, the transistor may effectively prevent the threshold voltage decrease due to a reduction in the thickness of gate insulating layer 141 and also due to short channel effects as the semiconductor device is highly integrated. Referring to FIG. 8, to ensure that carriers in germanium layer 120 are effectively supplied to epitaxial layer 130, epitaxial layer 130 and germanium layer 120 may be formed such that a ratio of a thickness a of epitaxial layer 130 to a thickness b of germanium layer 120 is a predetermined ratio, such as 1:2 to 1:4. For instance, referring to FIG. 3, when germanium layer 120 has a thickness of 200 Å, epitaxial layer 130 may be formed to have a thickness of about 100 Å.

In addition, referring to FIG. 8, which is an enlarged view of a portion A illustrated in FIG. 7, a ratio of a total thickness c of epitaxial layer 130 and germanium layer 120 to a critical dimension (CD) d, which is equal to the length of gate structure 140 may be in a range of 1:3 to 1:4. Also referring to FIG. 8, the critical dimension d may be equal to or greater than a horizontal length e of epitaxial layer 130 between source/drain regions 150, but equal to or less than a horizontal length f of germanium layer 120 between source/drain regions 150.

Although not illustrated in the figures or described above, a halo ion implantation region and/or a pocket ion implantation region may be formed to further reduce short channel effects.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. A method for fabricating a MOSFET, comprising:
   forming a germanium layer with a predetermined thickness by implanting germanium ions into a semiconductor substrate;
   etching an overlying portion of the semiconductor substrate disposed over the germanium layer to expose the germanium layer, wherein etching the overlying portion comprises etching the overlying portion by a wet etching process;
   forming an epitaxial layer doped with high concentration impurities on the exposed germanium layer;
   forming a gate structure on the epitaxial layer;
   forming source/drain regions in the semiconductor substrate; and
   forming a selective epitaxial layer on the source/drain regions, wherein the selective epitaxial layer is formed on a same horizontal plane with the gate structure.

2. The method according to claim 1, wherein the source/drain regions are spaced apart from each other by the germanium layer and the epitaxial layer.

3. The method according to claim 1, further comprising performing an ion implantation process to form a well region in the semiconductor substrate prior to forming a germanium layer.

4. The method according to claim 1, wherein forming the epitaxial layer comprises forming the epitaxial layer such that a ratio of a thickness of the epitaxial layer to a thickness of the germanium layer is in a range of 1:2 to 1:4.

5. The method according to claim 1, wherein the germanium layer, the epitaxial layer, and the gate structure are formed such that a ratio of a total thickness of the epitaxial layer and the germanium layer to a critical dimension of the MOSFET, which is equal to a length of the gate structure, is in a range of 1:3 to 1:4.

6. The method according to claim 1, wherein the gate structure and the source/drain regions are formed such that a critical dimension of the MOSFET, which is equal to a length of the gate structure, is equal to or greater than a horizontal length of the epitaxial layer between the source/drain regions, and is equal to or less than a horizontal length of the germanium layer between the source/drain regions.

* * * * *